United States Patent [19]

Meyerle

[11] 4,251,045

[45] Feb. 17, 1981

[54] METHOD AND APPARATUS FOR REDUCING UNDESIRED TRANSMISSION OF ACOUSTIC ENERGY FROM A LOUDSPEAKER CABINET AND FOR ACOUSTICALLY ISOLATING HIGH FIDELITY SETS THEREFROM

[76] Inventor: George M. Meyerle, Lakeview Dr. Candlewood Orchards, Brookfield, Conn. 06804

[21] Appl. No.: 11,069

[22] Filed: Feb. 12, 1979

Related U.S. Application Data

[63] Continuation of Ser. No. 740,136, Nov. 8, 1976, abandoned.

[51] Int. Cl.³ .......................... F16M 13/00; H05K 5/00

[52] U.S. Cl. .......................................... 248/619; 248/624; 181/148

[58] Field of Search .............................. 181/144–156, 181/199, 209; 248/20, 358 R, 399, 562, 617-620, 623, 624, 638; 267/103, 92

[56] References Cited

U.S. PATENT DOCUMENTS

| | | | |
|---|---|---|---|
| 75,306 | 3/1868 | Smith | 248/399 |
| 215,631 | 5/1879 | Kennedy | 267/92 |
| 2,144,566 | 1/1939 | Dreisbach | 248/20 |
| 2,744,718 | 5/1956 | Markowski et al. | 248/20 |
| 2,765,141 | 10/1956 | Applegate | 248/20 |
| 2,777,902 | 1/1957 | Goldmark | 181/144 |
| 3,342,498 | 9/1967 | Eberhardt | 181/148 |
| 3,357,717 | 12/1967 | Samford | 267/103 |
| 3,874,646 | 4/1975 | Vernier | 248/358 R |

FOREIGN PATENT DOCUMENTS

| | | | |
|---|---|---|---|
| 897450 | 5/1944 | France | 248/20 |

*Primary Examiner*—L. T. Hix
*Assistant Examiner*—Benjamin R. Fuller
*Attorney, Agent, or Firm*—Parmelee, Johnson, Bollinger & Bramblett

[57] ABSTRACT

Method and apparatus are disclosed for reducing undesired transmission of acoustic energy from a loudspeaker cabinet into the structure of a building in which the loudspeaker is located, and also for reducing the undesired acoustical feedback from the loudspeaker into the turntable assembly. A high-Q resonant external suspension apparatus is positioned beneath the cabinet of the turntable or the cabinet of the loudspeaker. This suspension apparatus includes compression springs having a predetermined taper and a very high-Q which are arranged to provide resonance in all three directions (X, Y and Z axes). The mass of the supported structure and the spring constant of the tapered springs are proportioned to provide a resonant frequency in the range from approximately 3 to 6.5 Hertz with approximately 4 Hertz being shown as the presently preferred value.

11 Claims, 7 Drawing Figures

FIG. 4
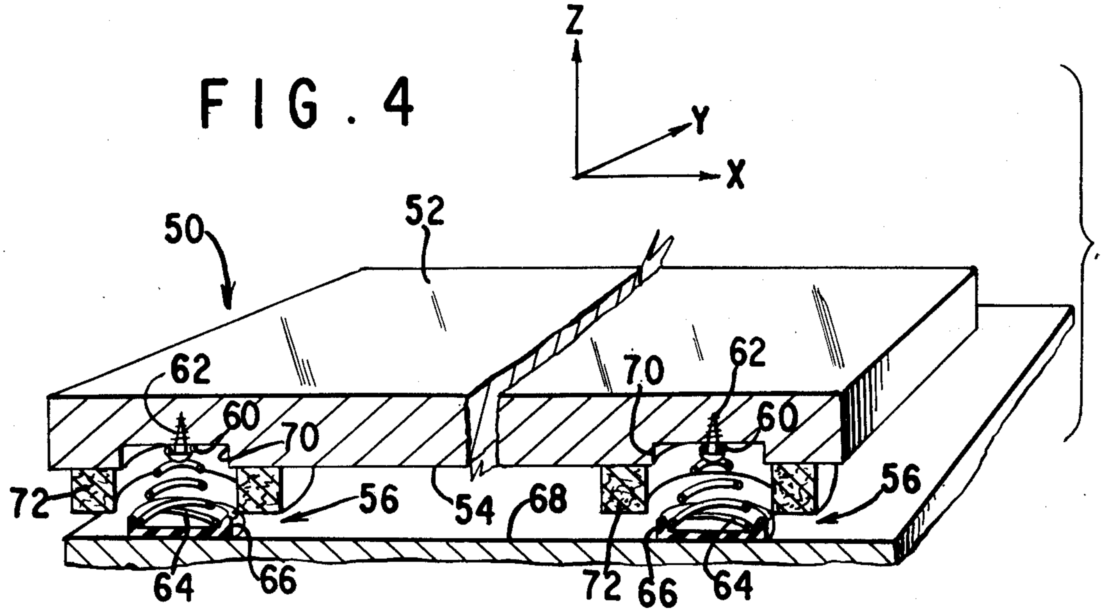
FIG. 5
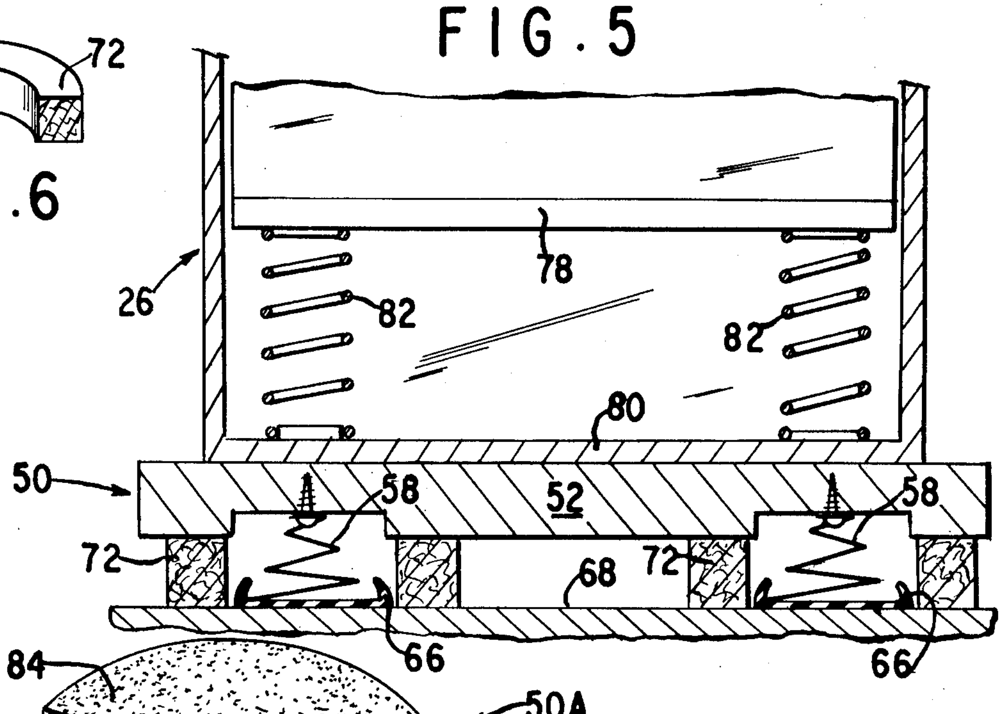
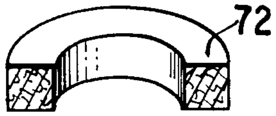
FIG. 6
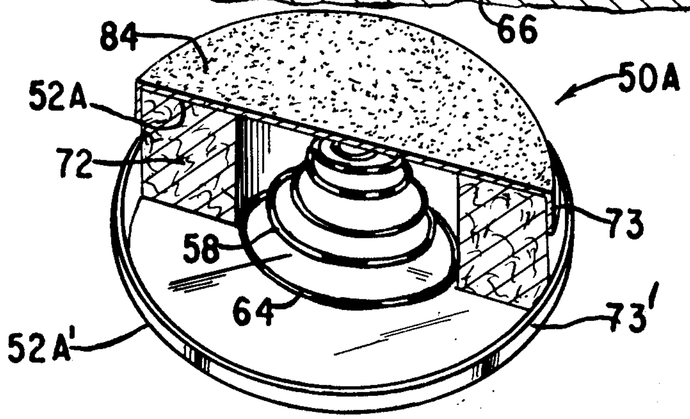
FIG. 7

METHOD AND APPARATUS FOR REDUCING UNDESIRED TRANSMISSION OF ACOUSTIC ENERGY FROM A LOUDSPEAKER CABINET AND FOR ACOUSTICALLY ISOLATING HIGH FIDELITY SETS THEREFROM

The present application is a continuation of prior pending application Ser. No. 740,136, filed on Nov. 8, 1976, which was abandoned following the filing of this present application.

FIELD OF THE INVENTION

The present invention is in the field of sound reproduction and more particularly relates to a method and apparatus for reducing undesired transmission of acoustical energy from a loudspeaker cabinet into other apartments or into other rooms in a dwelling, and for isolating the high fidelity record and tape equipment from the acoustical energy being transmitted from the loudspeaker and from the loudspeaker cabinet.

DESCRIPTION

Sound reproduction systems, such as high fidelity record and tape systems which are presently in use, generally consist of several components, which may include a turntable, speakers, amplifiers, tuners and the like. Turntables in particular have been provided with various internal spring suspension systems in an attempt to isolate the operative portions from their enclosures or cabinets.

It has been proposed to position a plurality of pads of resilient felt material or rubber underneath such components to prevent scratching of the surfaces of furniture on which they are placed and to prevent sound vibrations from being transmitted from the component to the supporting surface and then into the surrounding atmosphere. While a certain amount of sound has been absorbed by such pads or rubber feet, there still remains a significant amount of acoustical energy which is transmitted from the loudspeaker cabinet into the structure of the building, thereby causing the structural elements of the building to vibrate. That is, in a prior art installation, as shown in FIG. 1, the wall panels, flooring, floor joists, frames and so forth, are forced into vibration, causing a transmission or conduction of the sound into other rooms or into other apartments in the building, thereby annoying people who may be located fairly remote from the loudspeaker itself.

Moreover, a significant amount of the acoustical energy being transmitted from the loudspeaker in a prior art installation travels through the air and through the building structure and into the reproducing equipment, causing undesired vibration of the phonograph turntable, tone arm and pick-up cartridge. In other words, undesirable acoustical feedback occurs, producing an increased amplification or emphasis of certain frequencies within the spectrum of frequencies issuing from the loudspeaker.

As shown in FIG. 2, in a typical prior art installation, the high-fidelity sound reproducing system transmits acoustical energy from the loudspeaker or multiple loudspeakers over the spectrum from approximately 20 Hertz to appxoimately 20,000 Hertz. This is an approximate range for there is a diminution or "roll off" in acoustical energy output toward either end of the range. In comparing the performance of various sound reproduction systems, the shape or slope of this roll off at the high and low frequency ends of the spectrum may vary significantly, depending upon the particular characteristics of the cartridge, tone arm, amplifier, and loudspeaker being used. In a prior art installation, there is a significant, undesirable amount of acoustical feedback occurring, which peaks usually in the range from approximately 100 Hertz to 1,000 Hertz. In other words, the peak in response as caused by feedback effects typically falls within or near the mid-range of human hearing, where sensitivity to sound is often most acute.

This positive feedback, for example, such as shown in FIG. 2 dotted at 20 or at 21 near 100 Hertz or 1,000 Hertz, reinforces the overall response characteristics of the system as a whole, producing a corresponding peak or maximum in energy output, as shown dotted at 20' or 21'. These dotted curves 20, 20' and 21, 21' are intended to be illustrative only, as to their shape, relative amplitude and location in the frequency spectrum.

The actual positive feedback which is occurring in a prior art installation depends upon a large number of variables including such as: the room size, building structure, stiffness; loudspeaker cabinet mass, structure and stiffness; furniture on which the various components of the sound reproduction equipment are mounted; and the mass, structure, stiffness of the cabinet for the turntable, as well as the various internal suspension systems employed for the components, and so forth. Therefore, it is to be understood that the showing in FIG. 2 is to be interpreted as being illustrative of the typical range in which undesired acoustical feedback occurs in prior art installations.

It is an object of the present invention to provide an external suspension system for the cabinet of a component of a sound reproduction system, such as the turntable cabinet or loudspeaker cabinet, which produces predetermined high-Q resonances in all three directions (X, Y and Z axes) for the suspended cabinet for significantly reducing the amount of positive acoustical feedback occurring in the overall sound reproduction system.

It is a further object of the present invention to increase the acoustical isolation of a component of a sound reproduction system by providing dual resonance for the component which has an internal suspension system between the component and its cabinet.

According to an aspect of the present invention, there is the advantage of reducing the annoyance of other apartment residents or to other members of a family who are located on other floors of a dwelling when a high fidelity loudspeaker system is being operated, by de-coupling the loudspeaker cabinet from the structure of the building.

According to one aspect of the present invention, a component such as a turntable of a sound reproduction system, which is suspended within its cabinet by an internal suspension system having mainly resonance in one direction, has its cabinet positioned upon a supporting surface by further external suspension apparatus providing predetermined high-Q resonances in all three directions (X, Y and Z axes) for the cabinet, which differs in frequency response from the resonance of the internal suspension system. The cabinet suspension apparatus may comprise a platform and at least one tapering compression spring attached to the platform and arranged so as to project below the lower surface of the platform with a cup of surface-protective material receiving the lower end of the tapered compression spring. The platform may be of sufficient size to be provided with at least three springs or may be relatively small, so as to have only one spring attached thereto with an adhesive applied to the other surface of the relatively small platform to assist in attaching the platform to the cabinet. An annular member of vibration damping material, for example, such as foam material is positioned around each spring to damp slightly the springs for slightly modifying the high-Q resonance of the external suspension apparatus in all three directions.

Other features, aspects, and advantages of the present invention will become more fully understood from a consideration of the following description in conjunction with the accompanying drawings, which are to be viewed as exemplary of the invention.

BRIEF DESCRIPTION OF THE DRAWINGS

In the drawings:

FIG. 4 is a perspective view shown partially in section of external suspension apparatus embodying the present invention and having resonance in the X, Y, and Z directions;

FIG. 5 is a cross-sectional view showing the external suspension apparatus in use according to the present invention and providing dual resonance with the internal suspension system within the turntable cabinet;

FIG. 6 is a perspective view of a foam damper for the springs of the suspension apparatus; and FIG. 7 is a perspective view of a modification of the suspension apparatus.

DETAILED DESCRIPTION

Proceeding next to the drawings, wherein like reference symbols indicate the same parts throughout the various views, a specific embodiment of the present invention and modifications thereof, will be described in detail, together with problems of the prior art.

Figure 1:
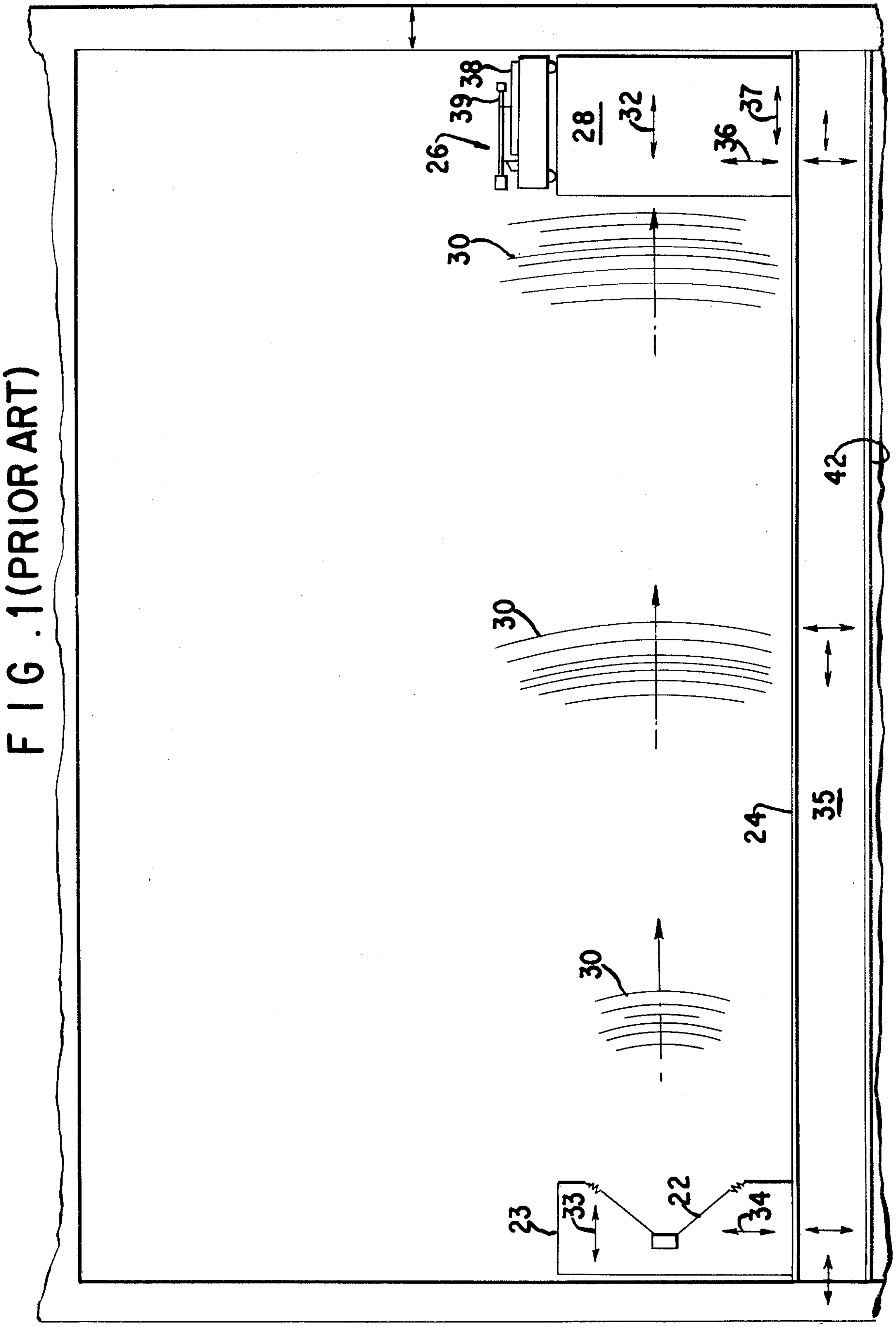
FIG. 1 (PRIOR ART)
FIG. 1 shows a prior art installation of a high fidelity sound reproduction system in a room in a building for purposes of explaining problems arising therefrom which are significantly overcome by the present invention.
Figure 2:
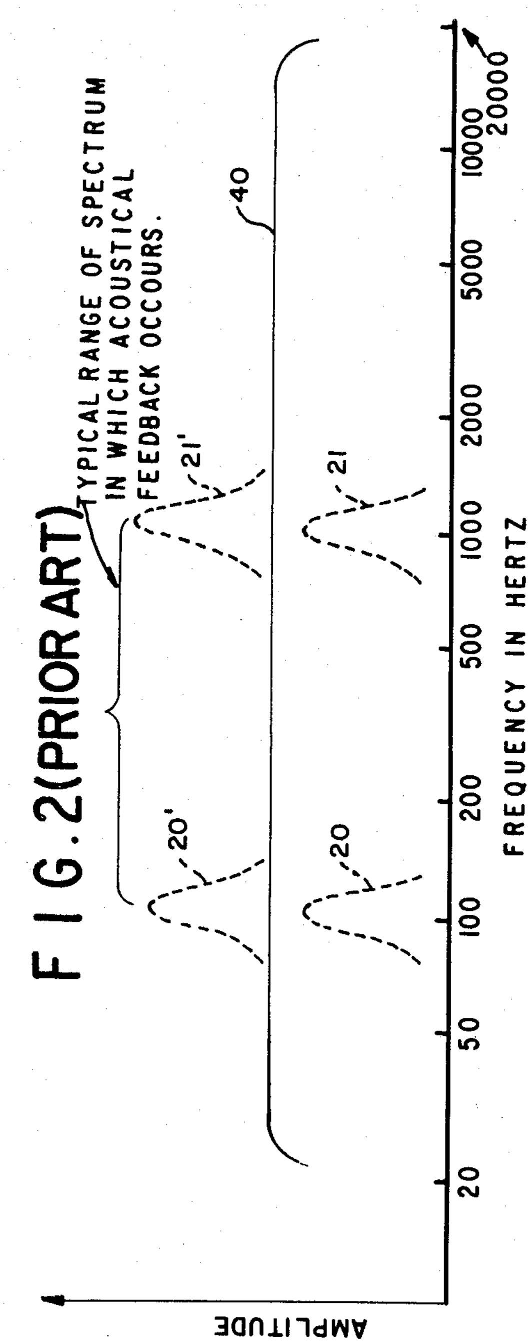
FIG. 2 (PRIOR ART)
FIG. 2 is a plot of the overall amplitude versus frequency response of a typical prior art high fidelity sound reproduction system for illustrating the problems of acoustical feedback.

As shown in FIG. 1, a loudspeaker 22 in its cabinet 23, is resting on a floor 24 and a high fidelity radio tuner, phonograph and amplifier set 26 is positioned on a piece of furniture such as a drawer chest 28. During operation of this sound reproduction equipment, the loudspeaker 22 transmits sound waves as diagrammatically indicated at 30 into air in the room. These sound waves strike against the furniture 28 on which the hi-fi set 26 is positioned. The result is to impart back and forth movement 32 to the furniture which, in turn, is mechanically coupled into the sound reproduction set 26.

In addition, the sound waves 30 cause some deflections and vibration of the floor and walls which become transmitted into the components of the set 26. The loudspeaker cabinet 23 is set in vibration in reaction to the motion of the loudspeaker 22, and the resultant cabinet motion may include both horizontal and vertical components 33 and 34. This motion 33 and 34 of the cabinet 23 produces corresponding vibrations in the floor and walls of the room. The flooring 24 and the floor joists 35 beneath are caused to vibrate, contributing up and down and lateral movement 36 and 37 to the bottom of the furniture 28.

The cumulative effect of these various acoustical energy transmission paths through the air and through the building structure is to feed acoustical energy back into the set 26 and into the turntable 38 and tone arm 39, and the pick-up cartridge on the tone arm, causing the undesired feedback 20 or 21. As discussed briefly above, this acoustical feedback typically has its maximum effect 20' or 21' on the frequency response 40 of the overall sound reproducing system near the mid-range of human hearing, for example, in the range from approximately 100 cycles to 1,000 cycles, thereby producing distortions or undesired emphasis in certain portions of the overall response 40 of the hi-fi system.

Furthermore, the vibrating of the building structure including the flooring 24 and floor joists 35 serves to transmit the acoustical energy into other apartments or onto other floors in the building. In a prior art situation, as shown in FIG. 1, a person downstairs is likely to be annoyed by a disturbing thump, thump, thump, as the lower frequency components of the music are strongly carried down through the floor structure into the ceiling 42 of the room below.

As shown in FIG. 4, there is indicated generally at 50 suspension apparatus according to the present invention which comprises an essentially rigid platform or base 52 consisting of a piece of particle board approximately $\frac{3}{4}$ of an inch thick and weighing about $3\frac{1}{2}$ to 5 pounds having an attractive woodgrained plastic coating finish. This platform 52 is rectangular and may range from twelve to seventeen inches along an edge thereof, for example, a suitable size for use with many hi-fi sets may measure $13\frac{1}{2}$ by 16 inches. Arranged to project below the bottom surface 54 are four spring assemblies 56, only two of which can be seen. These spring assemblies are located near each of the respective corners of the platform 52. The springs 58 are each tapered with the same predetermined taper and each has the same predetermined spring constant. Each spring has a smaller diameter upper end 60 which is attached by a screw 62 to the platform 52 and a larger diameter lower end 64 which is captured within a snug fitting resilient caster cup 66 of rubber or the like so as to prevent marring or scratching of a furniture surface 68 upon which the suspension apparatus 50 is positioned.

A circular socket 70 is machined up into the bottom surface 54 of the platforms 52 having a diameter at least as large as the outside diameter of the larger lower end 64 of the spring. The attachment point 62 for the upper end 60 of the spring is located concentric within this socket 70. This socket reduces the overall headroom requirement for the spring assemblies since the upper end of the spring 58 is effectively countersunk up into the platform. Moreover, the socket 70 provides clearance so that the spring assembly 56 has compliance in both horizontal directions (X and Y axes as indicated by the coordinate arrows) as well as compliance in the vertical direction (Z axis).

Around each spring 58 is positioned an annular damping member 72 of resilient foam material, for example, such as sponge rubber or sponge resilient plastic which slightly damps the spring motion.

In actual use, the annular damping member 72 rests down upon the furniture surface 68 because the weight of the platform 52 (approximately 3½ to 5 lbs.) plus the weight of the turntable assembly (approximately 15 to 19 lbs.) resting thereon serves to compress the springs 58 until the damping member 72 is also slightly compressed. The weight of the platform 52 alone, as shown in FIG. 4, may not compress the springs enough to cause the lower surface of damping members 72 to touch the furniture surface 68.

Each of the tapered springs 58 is selected so as to have a very high Q resonance and also to have resonance in all three coordinate directions X, Y and Z, as will be discussed in detail further below.

It is noted that most prior art internal spring systems are simply vertical spring systems, and they offer very compliant characteristics if anyone attempts to push the supported structure in a horizontal direction. Thus, the prior art vertical spring systems usually have vertical guides or stops associated with them for limiting the horizontal movement of the supported structure. Unfortunately, the large lateral compliance of vertical spring systems when used to support phonograph turntable assemblies usually makes the turntable more (rather than less) responsive to airborne acoustical feedback 30 (FIG. 1) which tends to act in a horizontal direction.

In a typical high fidelity sound reproduction system, the loudspeaker 22 (FIG. 1) has its maximum resonance occurring at a frequency of approximately 20 Hertz. The tone arm 39 has its maximum resonance at a frequency of approximately 8 Hertz.

Figure 3:
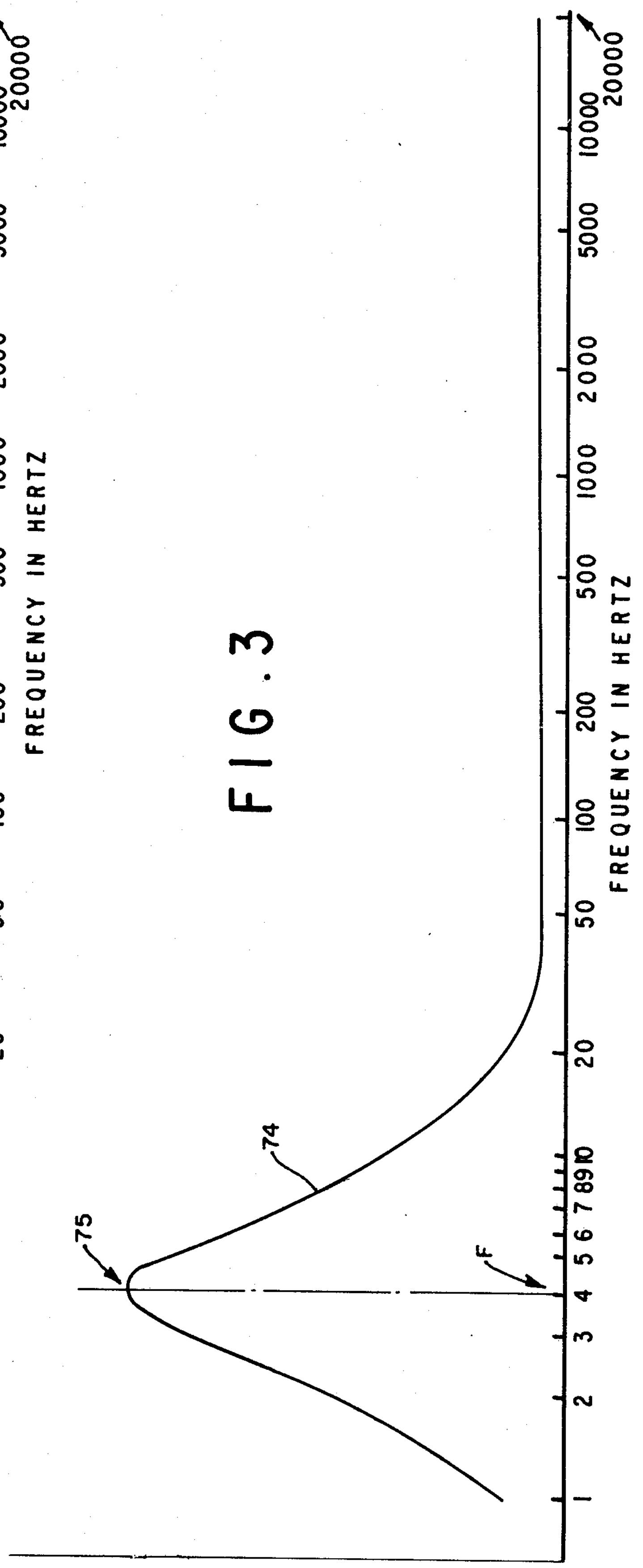
FIG. 3 is a plot versus frequency illustrating the predetermined high-Q resonance characteristic produced by use of external suspension apparatus embodying the present invention and showing its location in the mechanical vibrational frequency spectrum.

In order to reduce the acoustical feedback, as shown in FIG. 3, it is desired that the maximum resonance 75 in the three directions X, Y and Z each occur at approximately the same frequency F and that this frequency F be located well below the usual tone arm resonance frequency of approximately 8 Hertz. The curve 74, as shown in FIG. 3, is a plot of the amplitude of vibration response as a function of frequency of the platform 52 with a component such as a turntable assembly resting thereon. The high-Q springs 58 when damped by the encircling foam material members 72 desirably have a Q in the range from approximately 5 to 20. The preferred value of Q is approximately 10 for many turntable assemblies, and the curve 74 is based upon a Q of approximately 10.

The resonant frequency $F_o$ of an undamped vibrating system can be expressed as:

$$F_o = \left(\frac{1}{2\pi}\right) \times \sqrt{\frac{K}{M}} \quad (1)$$

where "K" is the total stiffness of the sum of the supporting spring assemblies 56 in dyness per centimeter and "M" is the total vibrating mass in grams which is essentially equal to the sum of the mass of the platform 52 plus the mass of the turntable assembly 26 resting on the platform. In the case of a damped vibrating system, such as is involved here, the motion is not periodic, since each swing of the vibrating system is of somewhat smaller amplitude than the one before it. Thus, strictly speaking, one would not use the term "resonant frequency" in connection with damped, i.e. non-periodic motion. However, the motion would be periodic in the absence of damping. Therefore, if the damping by the foam members 72 is not unduly large, it is reasonable to assume that the overall motion, when set into vibration, is nearly periodic and consequently that equation (1) approximately applies to apparatus embodying the present invention.

As mentioned above, the resonant frequency F provided by the external suspension apparatus 50 (FIGS. 4 and 5) or 50A (FIG. 7) for a turntable cabinet is desirably located well below the usual tone arm resonance occurring at approximately 8 Hertz. Thus, the resonant frequency F is preferably located within the range from appoximately 3 Hertz to approximately 6.5 Hertz, with an optimum value being approximately 4 Hertz, as illustratively shown in FIG. 3.

The reason why it is not usually desirable to strive for a resonant frequency below approximately 3 Hertz is that the typical resonant frequency of a conventional floor structure is of the order of the range of appoximately 1 Hertz to 2 Hertz. Therefore, if the resonant frequency of the suspension apparatus 50 or 50A is too low for a turntable assembly, the turntable assembly will tend to shake by becoming responsive to movement of the floor structure as caused by a person being in the room. Accordingly, the resonant frequency of the external suspension apparatus is desirably below the typical tone arm resonant frequency (approximately 8 Hertz) and above the typical floor structure resonant frequency (approximately 1 Hertz to 2 Hertz).

By virtue of the fact that the platform 52 itself has a significant mass of approximately 3½ to 5 pounds, it serves to confine to a more limited range the resonant frequency actually achieved with various commercially available turntable assemblies, which may have somewhat different masses. For example, such turntable assemblies, as indicated above, may have a weight in the range from approximately 15 lbs. to 19 lbs., a maximum percentage variation of approximately 27%. When supported on a platform 52 weighing 5 lbs., the suspended mass of a turntable assembly plus the platform has a combined weight of approximately 20 lbs. to 24 lbs., a maximum variation of approximately 20%. Therefore, the resultant variation in the resonant frequency F as calculated by equation (1) above, which is dependent upon the total suspended mass, will be confined to a narrower limit, thereby being more nearly centered at the optimum value, regardless of the mass of the particular commercially available turntable assembly actually being suspended.

It is known that the relationship between bandwidth (BW) to the 3 db (0.707 of the amplitude) points in a resonant system and the Q of the system can be expressed as:

$$BW = \text{c.f.}/Q = 4/10 = 0.4 \quad (2)$$

where c.f. is the center frequency F. Thus, with a Q of 10 the bandwidth is 0.4 Hertz and so the 3 db points occur at 3.8 cycles and 4.2 cycles.

Therefore, the resonance response curve 74 is relatively low at the tone arm resonant frequency of 8 Hertz and is very low over the desired range of approximately 20 Hertz to 20,000 Hertz. The advantageous result is that the acoustical feedback is reduced throughout the entire useful range of 20 Hertz to 20,000 Hertz. At some frequencies, the improvement with respect to the reduction of vibration feedback into a turntable and then through the pick up may be 100 times as compared with the prior art.

As may be seen in FIG. 5, a turntable assembly indicated generally at 26 includes a turntable chassis 78 mounted within a housing or cabinet 80 by means of its own separate suspension system 82 which may comprise a plurality of vertical springs or other resilient members. Suspension apparatus 50, as shown in FIG. 4 is positioned beneath the turntable cabinet so as to support it upon a supporting furniture surface 68. The resonance of the suspension apparatus 50 is different from the resonance of the suspension system 82 within the turntable cabinet. The turntable is thus provided with a dual resonance which increases its acoustical isolation. With this construction it is possible to reduce the overall acoustic feedback of a turntable assembly between 20 and 40 db which is between 10 and 100 times.

In the modification of FIG. 7, suspension apparatus, according to the present invention, is indicated at 50A and comprises a relatively small platform 52A having a disc shape with a downturned rim 73 approximately 3/16 inches deep. On the underside of the center of the disc platform 52A is attached a single spring 58. There is a similar disc platform 52A' of the same diameter positioned in opposed relationship to the platform 52A, and the large lower end 64 of the spring 58 is mounted at the center of the disc 52A'. There is an upturned rim 73' on the other platform 52A' so that the respective upturned and downturned rims 73 and 73' are in edge aligned relationship. The annular damping member 72 is secured to the inner surfaces of both discs 52A and 52A' adjacent to the respective rim flanges 73 and 73'. The suspension apparatus 50A can be used with either platform 52A or 52A' as the upper platform, i.e. either the large or small end of the spring 58 can be uppermost. The large end 64 of the spring 58 fits snuggly within the annular damping member 72 in FIG. 7. A pressure-sensitive adhesive layer 84 is provided on the upper side of the small platform 52A (or on platform 52A' if it is uppermost) so as to be able to attach it to the underside of a cabinet, such as the turntable cabinet 80 seen in FIG. 5, or the loudspeaker cabinet 23 seen in FIG. 1. Thus, a plurality of the suspension apparatus 50A are mounted underneath a cabinet, such as at the corners thereof.

The pressure-sensitive adhesive 84 is initially covered with a peelable layer of waxed paper, or the like, so that the fresh adhesive layer 84 can be exposed just prior to attachment to a cabinet.

It turns out in actual practice that this same three-axis resonance with a maximum resonance as shown at 75 below 8 Hertz is also well suited to reduce greatly the transmission of acoustical energy from a loudspeaker cabinet 23 (FIG. 1) into the floor. When the speaker assembly (cabinet 23 plus loudspeaker 22) weighs approximately 10 to 40 lbs. then four similar spring suspension units 50A are used with their damping members 72. For a speaker assembly weighing approximately 40 to 60 lbs., then six of these damped spring assemblies 50A are used. For a speaker assembly weighing above approximately 60 lbs., eight of the damped spring assemblies 50A are used. If the rim flanges 73 and 73' approach unduly closely to each other under the loudspeaker cabinet, then the user knows that the units 50A are overloaded, and two more should be employed beneath the particular loudspeaker cabinet involved.

It is pointed out that when the speaker is positioned against a vertical wall, suspension apparatus, according to the present invention, may be interposed between the speaker and this vertical wall so as to reduce significantly transmission of vibrations from the speaker to the wall.

The speaker and cabinet are usually more massive than a turntable assembly, and hence the resonant frequency of the suspended speaker cabinet is in the range below 8 Hz and may extend down close to approximately 2 Hz which is lower than for a turntable assembly.

Thus it can be seen that the present invention has provided suspension apparatus for turntable cabinets, speaker cabinets, and the like, which is particularly effective in decreasing the undesired acoustical feedback and in increasing the acoustical isolation of the component involved. This isolation is significantly increased when the component has its own separate suspension system since under these circumstances a dual resonance system is established.

In a particularly effective spring assembly 56 or in apparatus 50A the tapered spring 58 is made from high quality spring wire and has an overall height approximately equal to the outside diameter of its lower end. This spring has an overall individual stiffness K, in the range from 5 to 35 lbs. per inch. It is recognized that by using stiffer springs a fewer number of the units 50A can be used to support a given heavy cabinet.

The annular foamed damping member has an inside diameter to fit snuggly about the foot cup 66 when the spring 58 is compressed. The height and width of the annulus itself is approximately the same, so that the annulus has approximately a square cross section which works to advantage in providing the desired damping factor; however other proportions of spring and annular damping members will operate satisfactorily.

It will be understood that various details of construction and arrangement of parts may be made without departing from the spirit of the invention as defined in the appended claims.

I claim:

1. Apparatus for reducing the acoustic interaction between a component of a sound reproducing system contained in a cabinet and the structure of a room in a building in which said cabinet containing said component is located comprising:

- a platform adapted to have the cabinet placed thereon;
- a predetermined number of similar tapering compression springs each having smaller-diameter and larger-diameter ends;
- said compression springs each having one end thereof connected to said platform;
- said compression spring extending down below the bottom of said platform for acting in parallel support relationship;
- the lower ends of said springs having means thereon for resting upon a supporting surface in the room, said means being adapted for preventing marring or scratching of the supporting surface upon which said suspension apparatus is placed;
- said springs providing resilient spring action in all three orthogonal directions X, Y and Z between said platform and said supporting surface, said direction Z being perpendicular to said platform and said directions X and Y being perpendicular to each other and both being parallel with said platform;
- an annular damping member of resilient foam material encircling each of said tapering compression springs for providing damping for each of said springs in all three of said orthogonal directions for damping the relative vibrational movement between said cabinet and said supporting surface; and said predetermined number of tapered compression springs being adapted for acting conjointly with the mass of said cabinet plus the mass of the component contained therein plus the mass of said platform for providing damped resonant frequencies below 8 Hertz and above 2 Hertz in all three of said orthogonal directions X, Y and Z.

2. Suspension apparatus for reducing the acoustic interaction between a component of a sound reproduction system contained in a cabinet and the structure of a room in a building in which said cabinet is located, as claimed in claim 1, in which:

said component is a loudspeaker in a loudspeaker cabinet and said predetermined number of springs is related to the total weight of said loudspeaker and cabinet in accordance with the following table:

| Number of Tapering Compression Springs | Total Weight of Loudspeaker and Cabinet |
|---|---|
| 4 | 10 to 40 lbs. |
| 6 | 40 to 60 lbs. |
| 8 | above 60 lbs. |

3. Suspension apparatus for reducing the acoustic interaction between a component of a sound reproduction system contained in a cabinet and the structure of a room in a building in which said cabinet is located, as claimed in claim 1, in which:

said means for preventing marring or scratching of the supporting surface are a plurality of resilient cup-shaped caps with the lower end of each spring being nested in one of said caps; and each annular damping member has a sufficiently large internal diameter for engaging the supporting surface in encircling relationship about the respective cap on the lower end of the spring encircled by the damping member.

4. External suspension apparatus for use in supporting a cabinet containing at least a component of a sound reproduction system, said component being selected from the group consisting of a loudspeaker and a turntable, said external suspension apparatus comprising a platform adapted to be positioned externally of said cabinet and having a first side adapted to be engaged against the outside of the cabinet to be suspended;

said platform having a second side opposite to said first side;

a plurality of tapering compression springs each having a smaller-diameter end and a larger-diameter end;

a protective element on the larger-diameter end of each of said springs positionable against a supporting surface which is spaced from the second side of said platform, said protective element being arranged for protecting the supporting surface from being scratched by the respective spring, the smaller-diameter end of each of said springs being attached to said platform, and said protective element and the larger-diameter end of each spring normally projecting beyond the second side of said platform;

a plurality of annular damping members each secured to said second side of said platform, one of said damping members being positioned concentrically about each respective tapering spring for engaging the supporting surface in a region about the respective protective elements;

said tapering springs providing resilience in both directions X and Y parallel with said second surface and in the Z direction perpendicular to said surface; and said tapering springs with their respective annular damping members and said platform being adapted when said cabinet is supported on said platform to have damped resonant frequency responses in each of the three orthogonal directions X, Y and Z lying within the range from approximately 3 to 6.5 Hertz.

5. External suspension apparatus for a cabinet containing a component of a sound reproduction system, as claimed in claim 4, in which said tapering compression springs provide a high Q resonance of approximately 10 with the suspended cabinet in all three orthogonal directions X, Y and Z.

6. External suspension apparatus for a cabinet containing a component of a sound reproduction system, as claimed in claim 4, in which:

said annular damping member is formed of resilient foam material.

7. External suspension apparatus for a cabinet containing a component of a sound reproduction system, as claimed in claim 4, in which:

said second side of said platform has recesses formed therein; and said smaller end of each of said tapering compression springs is attached to said platform at a location within said recess.

8. External suspension apparatus for a cabinet containing a component of a sound reproduction system, as claimed in claim 7, in which:

said recesses are circular;

said smaller ends of said tapering compression springs are attached to said platform concentrically within said circular recesses; and the respective annular damping member is secured to said second side of said platform encircling said circular recess and concentric therewith.

9. External suspension apparatus for a cabinet containing a component of a sound reproduction system, as claimed in claim 4, in which:

said protective element is a resilient cup of rubbery material capturing the large diameter end of said tapering compression spring;

said resilient cup having a flat face adapted to engage against a supporting surface.

10. Suspension apparatus for use in supporting a cabinet, said cabinet having a turntable of a sound reproduction system mounted therein, said turntable being mounted within said cabinet by an internal resilient suspension system having a first resonance frequency, said cabinet being positionable above an external supporting surface and said suspension apparatus having a second resonance frequency which is different from said first resonance;

said suspension apparatus including at least one platform engageable with the outside of the cabinet and a bottom means engageable with the external supporting surface for preventing marring or scratching of the supporting surface;

a plurality of tapered compression springs extending between said platform and said bottom means;

an annular foam damping element encircling each of said springs for being partially compressed when said cabinet is resting upon said platform;

the second resonance frequency of said suspension apparatus when said cabinet is resting on said platform being a damped resonance frequency in the Z direction perpendicular to said supporting surface lying within the range below 8 Hertz and above 2 Hertz; and said suspension apparatus also having damped resonance frequencies in the orthogonal X and Y directions parallel with said supporting surface when said cabinet is resting upon said platform lying within the range below 8 Hertz and above 2 Hertz.

11. Suspension apparatus as claimed in claim 10, in which:

said bottom means for preventing marring or scratching of the supporting surface is a plurality of resilient cup-shaped caps with the lower end of each spring being nested in one of such cups; and each annular damping member has a sufficiently large internal diameter for encircling the cap on the lower end of the spring.

* * * * *